(12) United States Patent
Levine

(10) Patent No.: US 7,265,828 B2
(45) Date of Patent: Sep. 4, 2007

(54) SPECTROSCOPY IMAGER METHODS AND APPARATUS HAVING EXTENDED DYNAMIC RANGE

(75) Inventor: Peter Alan Levine, West Windsor, NJ (US)

(73) Assignee: Sarnoff Corporation, Princeton, NJ (US)

( * ) Notice: Subject to any disclaimer, the term of this patent is extended or adjusted under 35 U.S.C. 154(b) by 283 days.

(21) Appl. No.: 11/070,418

(22) Filed: Mar. 2, 2005

(65) Prior Publication Data

US 2005/0195302 A1    Sep. 8, 2005

Related U.S. Application Data

(60) Provisional application No. 60/549,202, filed on Mar. 2, 2004.

(51) Int. Cl.
*G01J 3/28* (2006.01)

(52) U.S. Cl. ............................ 356/326; 348/295

(58) Field of Classification Search ................ 356/326; 348/294
See application file for complete search history.

(56) References Cited

U.S. PATENT DOCUMENTS

| 5,173,748 A * | 12/1992 | Bilhorn ..................... 356/328 |
| 6,472,653 B1 | 10/2002 | Levine et al. |
| 2005/0001914 A1* | 1/2005 | Kueny ........................ 348/294 |

* cited by examiner

*Primary Examiner*—Gregory J. Toatley, Jr.
*Assistant Examiner*—Kara Geisel
(74) *Attorney, Agent, or Firm*—Lowenstein Sandler PC

(57) ABSTRACT

Methods and apparatus for imaging spectral lines are disclosed. Spectral lines are imaged using an imager that includes photosensitive cells. The photosensitive cells are arranged to form channels including banks of photosensitive cells. Horizontal blooming barriers and drains are coupled to one or more of the banks to limit accumulated charge in the banks such that the amount of charge accumulated and retained in at least one subsequent bank is incrementally increased. Charge is accumulated for spectral lines that are received by the channels to image those spectral lines.

27 Claims, 7 Drawing Sheets

SPECTROSCOPY IMAGER METHODS AND APPARATUS HAVING EXTENDED DYNAMIC RANGE

CROSS-REFERENCE TO RELATED APPLICATION

This application claims the benefit of U.S. Provisional Application No. 60/549,202, filed Mar. 2, 2004, the contents of which are incorporated herein by reference.

FIELD OF THE INVENTION

The present invention relates to imaging systems and, more particularly, to extending the dynamic range of spectroscopy imagers.

BACKGROUND OF THE INVENTION

Spectroscopy imagers disperse a light source (e.g., from an object) into spectral lines and collect the photonic charges of the spectral lines with an imaging device such as a charge coupled device array (CCD). A typical CCD incorporates photosensitive devices arranged in rows and columns to collect photonic charge. The photosensitive devices convert collected photonic charge into electrical charge. The electric charge is then accumulated across multiple photo-detectors, e.g., by row or column, for analysis.

When a CCD collects photons from high intensity spectral lines, charges accumulating within the CCD may exceed the capacity of the individual photosensitive devices. To prevent excess charge from influencing adjacent photosensitive devices, the excess charge is generally drained away. This draining, however, results in the loss of spectral line detail. Accordingly, a need exists for improved spectroscopy imaging methods and apparatus that extend the dynamic range of spectroscopy imagers to capture details within high intensity spectral lines.

SUMMARY OF THE INVENTION

The present invention is embodied in methods and apparatus for imaging spectral lines. Spectral lines are imaged using an imager that includes photosensitive cells. The photosensitive cells are arranged to form channels including banks of photosensitive cells. Horizontal blooming barriers and drains are coupled to one or more of the banks to limit accumulated charge in the banks such that the amount of charge accumulated and retained in at least one subsequent bank is incrementally increased. Charge is accumulated for spectral lines that are received by the channels to image those spectral lines.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements. This emphasizes that according to common practice, the various features of the drawings are not drawn to scale. On the contrary, the dimensions of the various features are arbitrarily expanded or reduced for clarity. Included in the drawings are the following figures:

FIG. 6 illustrates an exemplary response characteristic of a CCD device in accordance with the exemplary embodiment of FIG. 5a;

DETAILED DESCRIPTION OF THE INVENTION

Figure 1:
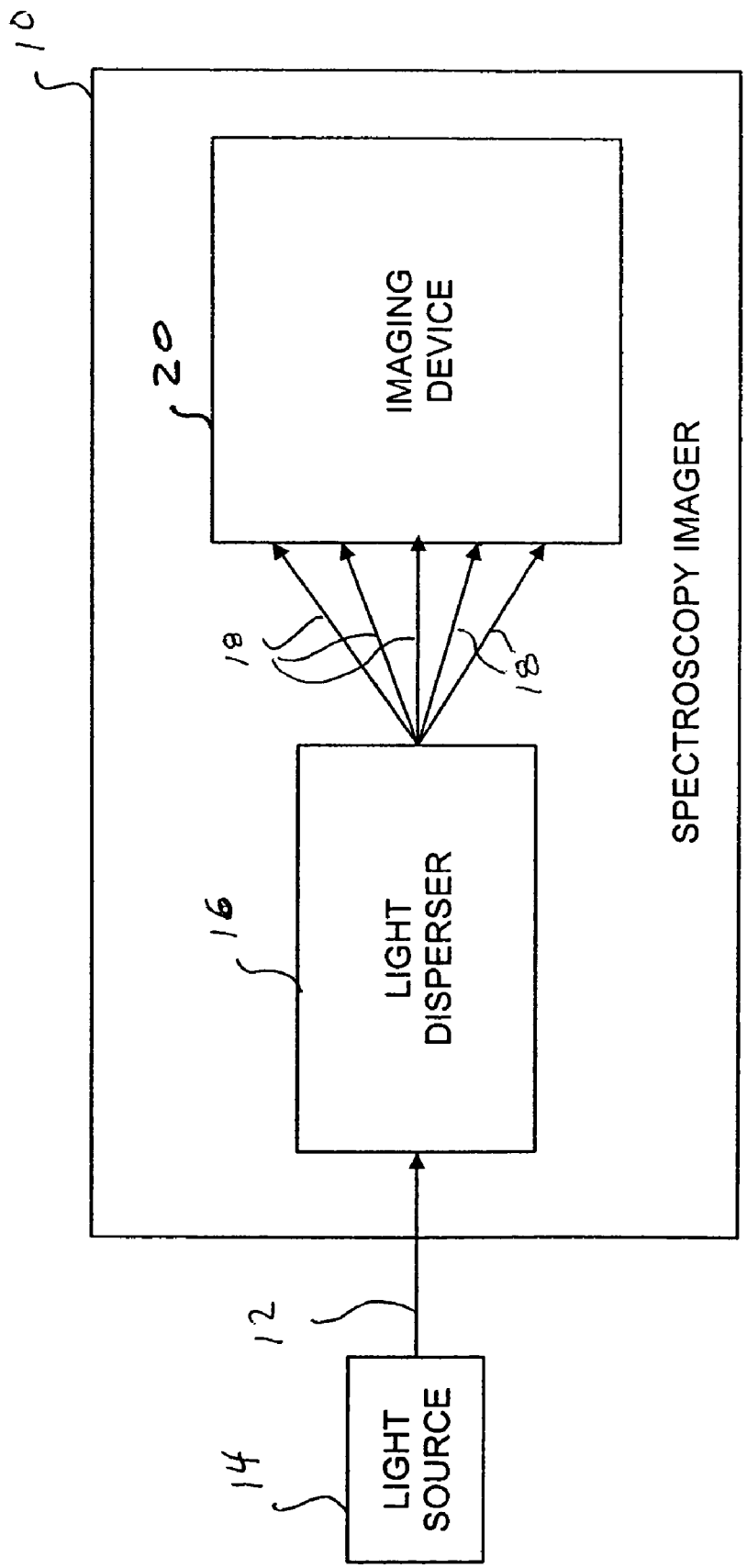
FIG. 1 is a block diagram of an exemplary spectroscopy imager in accordance with an aspect of the present invention.

FIG. 1 depicts an exemplary spectroscopy imager 10 for imaging photonic energy 12 received from a light source 14. The light source 14 may represent light emitted by an object or light reflected by or transmitted through an object and the photonic energy may represent an image of the object. Suitable light sources 14 for use in the present invention will be understood by one of skill in the art from the description herein.

A light disperser 16 disperses the photonic energy 12 into spectral lines 18 for collection by an imaging device 20. The imaging device 20 collects the photonic energy in the spectral lines 18 and converts the collected photonic energy into electrical energy. In an exemplary embodiment, the imaging device 20 is a time delay and integrate (TDI) imager. Exemplary light dispersers 16 include, by way of non-limiting example, prisms, diffractive gratings, apertures, slits (e.g., a vertically oriented slit), or essentially any device capable of dispersing light. The selection of a suitable light disperser 16 for use in the present invention will be understood by one of skill in the art from the description herein.

Figure 2:
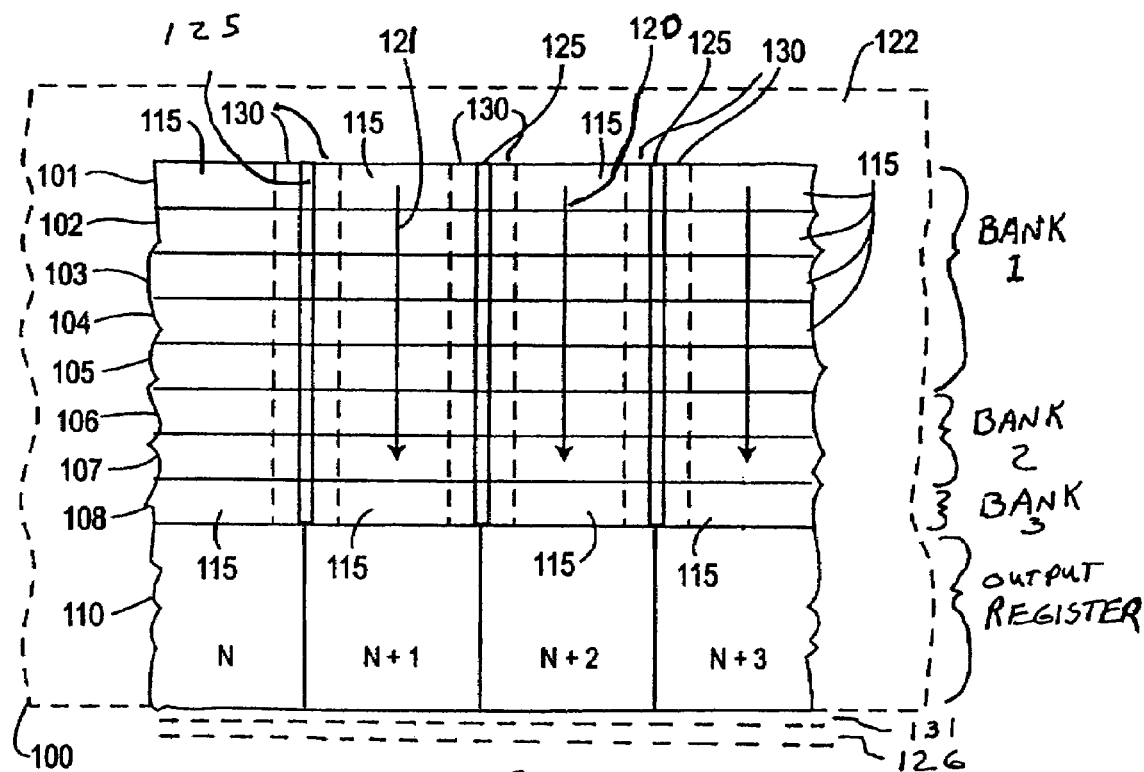
FIG. 2 illustrates a schematic diagram of an exemplary CCD device for use in the spectroscopy imager of FIG. 1.

FIG. 2 depicts a portion of a CCD 100 for use as an imaging device 20 (FIG. 1). The CCD 100 includes a plurality of photosensitive devices (referred to herein as cells) 115. In the illustrated embodiment, the cells 115 are arranged into an array including eight rows (represented by stages 101-108) and a plurality of columns, of which four are illustrated for descriptive purposes (i.e., adjacent columns N, N+1 . . . N+3). In an exemplary embodiment, the spectroscopy imager 10 (FIG. 1) is configured to direct the spectral lines 18 onto the columns of the CCD 100 for collection of photonic charge. More specifically, each column receives the photonic charge of at most one spectral line.

In exemplary operation, the photonic charge in a portion of a spectral line 18 (not shown in FIG. 2) is initially collected by a cell 115 in a first stage (e.g., stage 101) corresponding to that portion for conversion to an electrical charge. The electrical charge from the first stage is then transferred to a cell 115 in a second stage (i.e., stage 102), which collects photonic charge from another portion of the spectral line 18 for conversion to an electrical charge and adds the converted electrical charge to the electrical charge transferred from the previous stage. Thus, the charge collected in cell 115 associated with stage 101, for example, is added or transferred to cell 115 associated with stage 102. Similarly, the accumulated charge in cell 115 associated with stage 102 is added to the charge collected in cell 115 associated with stage 103. This transferring of accumulated electrical charge from a cell in one stage to a cell in a subsequent stage continues, one stage at a time, until an end stage is reached (e.g., stage 108). The accumulated charge is then read out from the CCD 100 at an output register (e.g., stage 110).

In transferring the collected charge for each cell 115 to a subsequent cell 115, the charge is transferred along a channel of cells 115, known as a transfer channel, illustrated for one channel of cells as transfer channel 120 (i.e., column N+2). When the energy collected in one cell 115 exceeds the maximum capacity of that cell, the excess energy may overflow the cell and "spread" into adjacent cells. To prevent the accumulated charge in the cells of one transfer channel from influencing the accumulated charge in cells in an adjacent channel, such as transfer channel 121 (i.e., column N+1), adjacent channels may be isolated from one another by blooming drains 125 and barriers 130. The level at which accumulated charge is deemed excessive is determined by the barrier 130 that exists between, for example, transfer channel 120 and drain 125. The greater the level, or potential, of barrier 130, the greater the amount of accumulated charge that may be collected in each cell 115. Generally, the levels of barrier 130 may be set to achieve the maximum accumulation of charge (i.e., saturation level) in a cell 115. As illustrated, barrier 130 is positioned horizontally adjacent to channel 120 and 121. As would be known in the art, barrier 130 may also be positioned vertically adjacent to channels 120 and 121 to limit the charge capacity of cell 115.

In an alternative exemplary operation, the cells 115 may be grouped into banks for accumulation of charge. A bank of cells 115 is made up of one or more cells 115. For example, a first bank (bank 1) may be made up of the cells 115 in stages 101 through 105, a second bank (bank 2) may be made up of the cells 115 in stages 106 and 107, and a third bank (bank 3) may be made up of the cell 115 in stage 108. The charge within each bank may be accumulated as described above. The accumulated charge within each bank may then be combined in an output stage, e.g., stage 110. This technique is referred to herein a "binning" and may be used to improve signal to noise ratio (SNR) for low intensity spectral lines. With three banks, three lines would be read out to the output stage 110, e.g., one from each bank. For example, accumulated charge from the first bank may be read out to the output stage 110, followed by accumulated charge from the second bank, followed by the charge from the third bank. An output barrier 131 and a blooming drain 126 may be added to the bottom of the output register (e.g., stage 110) to prevent large signals from blooming into horizontally adjacent cells due to high intensity spectral lines.

Figure 3:
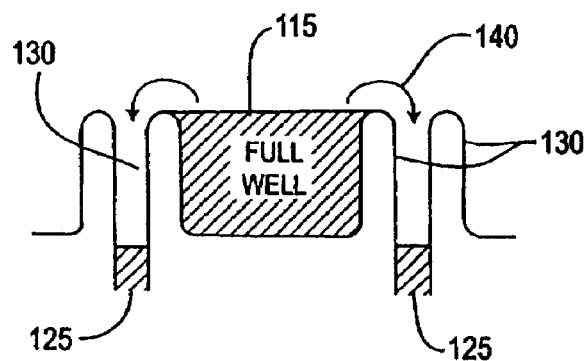
FIG. 3 depicts a cross-sectional view of a cell and barrier of a CCD structure within the CCD device of FIG. 2.

FIG. 3 illustrates the operation of the barrier 130 in controlling excessive charge. As shown, a cell 115 fills to a value that is set by the barrier 130. When the accumulated charge exceeds the level of the barrier 130, the excess, as represented by charge 140, is directed into a drain 125. In this illustrative example, when the maximum charge is achieved, any further charge that may be collected is simply discarded. The maximum level of barrier 130 thus limits the accumulated charge.

Figure 4:
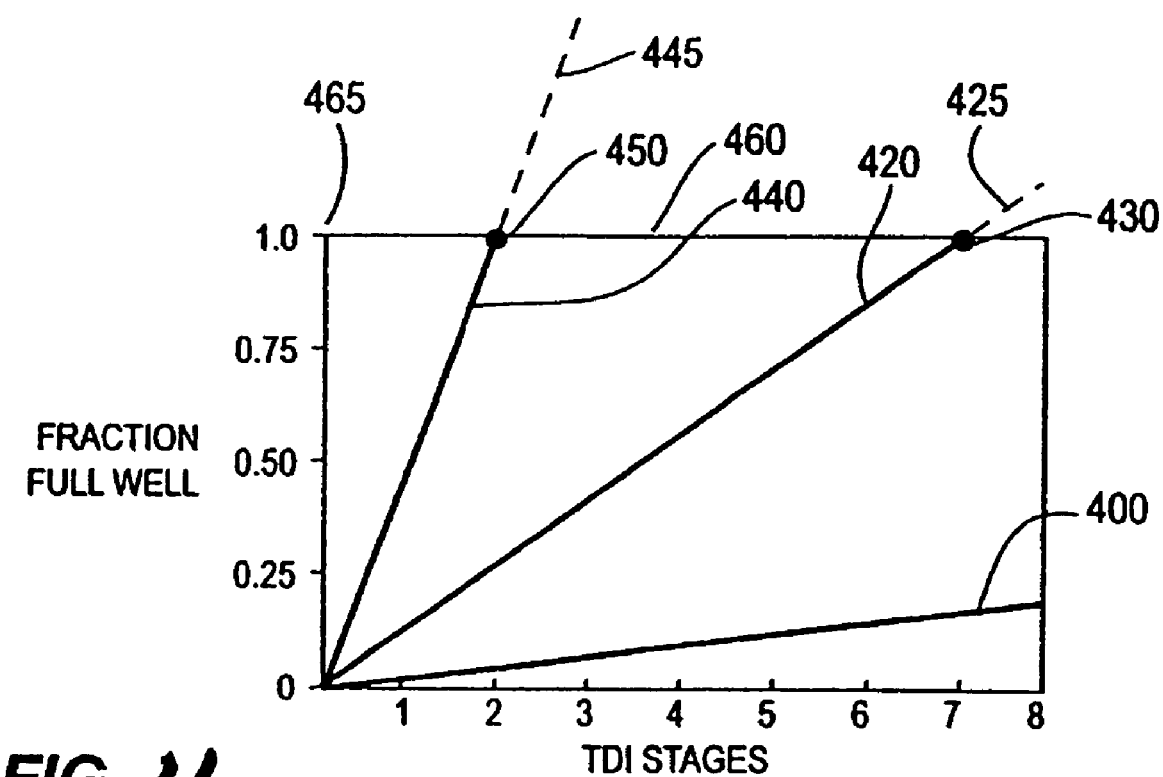
FIG. 4 illustrates typical response characteristic of the CCD device of FIG. 2.

FIG. 4 illustrates an exemplary performance characteristic of the CCD 100 (FIG. 2) for three spectral lines with increasing brightness levels. For a first exemplary spectral line, the charge collected by the CCD 100 is represented by response characteristic 400. In this example, each cell 115 in a stage adds a substantially similar amount of charge to the cell 115 in the next subsequent stage. The accumulated charge collected increases proportionally to the number of stages in the CCD 100. For this first exemplary spectral line, the total amount of charge collected after the eight stages remains below the barrier level 465 set by barrier 130.

For a second exemplary spectral line, which is brighter than the first exemplary spectral line, the charge collected by the CCD 100 is represented by response characteristic 420. In this example, more charge is collected in each cell 115 (relative to that collected for response characteristic 400). The accumulated energy collected would normally continue along dashed line portion 425 of response characteristic 420 until the accumulated charge is read out at the output stage 110. When the collected charge exceeds barrier level 465 (as happens in this example near the end of the sixth stage 106), however, the excess charge is drained into drain 125. The accumulated charge thus remains limited, or clipped, at the barrier level 465, as represented by response characteristic 430. Any spectral line detail that may be captured in the dashed line portion of response characteristic 420 is not processed and is therefore lost.

For a third exemplary spectral line, which is brighter than the second exemplary spectral line, the charge collected by the CCD 100 is represented by response characteristic 440. In this example, the brightness of the third exemplary spectral line causes the accumulated charge to exceed the maximum level set by barrier 130 (at level 465) after only about two of the CCD stages (i.e., stages 101 and 102). Were the accumulated charge permitted to accumulate through subsequent CCD stages, that charge would be represented by the dashed line portion 445 of response characteristic 440, but the charge is limited by barrier level 465. Barrier level 465 thus limits the response characteristic of the CCD 100. Charge above barrier level 465 is removed via drain 125 and the accumulated charge for this third exemplary spectral line thus remains limited at level 465, as represented by response characteristic 460.

Figure 5A:
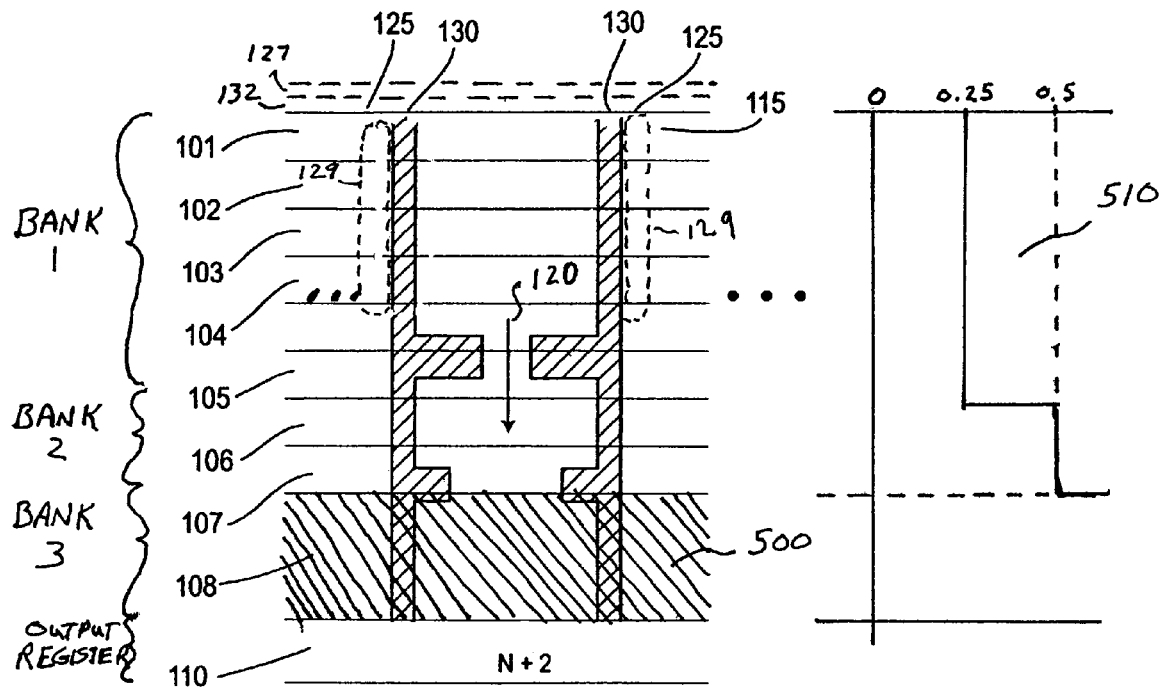
FIG. 5a illustrates an exemplary embodiment of limiting charge capacity in accordance with an aspect of the present invention.

FIG. 5a illustrates an exemplary embodiment for fabricating a CCD 100 for use in accordance with an aspect of the present invention. In the illustrated embodiment, barrier 130 is selectively set in accordance with a capacity charge curve 510 to achieve exemplary step-wise accumulated charge characteristics such that the amount of charge accumulated and retained in each bank of cells is incrementally increased. In this illustrated example, barrier 130 is selectively set to limit the amount of data collected in the early stages of collection while allowing for incrementally greater amounts of charge in latter stages. Thus, stages 101-105 (bank 1) accumulate 25 percent of the charge that could be collected. Stages 106 and 107 (bank 2) accumulate 50 percent of the charge that could be collected, and stage 108 (bank 3) allows for the accumulation of a maximum amount of charge. With the illustrated configuration, the maximum amount of charge may be collected without causing a saturation of individual cells 115.

In this embodiment, the cell charge capacity is set in designated stages to limit the accumulated charge in the banks. As illustrated, the cells 115 in stages 101 through 104 are set at a maximum level 465 (i.e., full collection capacity). At stage 105, the charge capacity of cell 115 is reduced to twenty-five (25) percent of maximum level 465 and, thus, bank 1 is limited to twenty-five (25) percent of maximum level 465 by the corresponding barrier level of stage 105. At stage 106, the charge capacity of cell 115 is again increased to maximum level 465. At stage 107, the charge capacity of cell 115 is reduced to fifty (50) percent of maximum level 465 and, thus, bank 2 is limited to fifty (50) percent of maximum level 465 by the corresponding barrier level of stage 107. Finally, at stage 108, the charge capacity of cell 115 is again increased to maximum level 465 and, thus, bank 3 is able to grow to one-hundred (100) percent of maximum level 465. The narrow channel regions at stages 105 and 107 are referred to herein as charge clippers. Alternatively, shallow channel regions may be employed to clip the charge in the banks.

In accordance with an aspect of the invention, the dynamic range of a CCD 100 is extended by selectively setting levels of barriers that limit the charge collection capability. The selectively set barrier levels shift the reference point of accumulated charge. The altered, or shifted, reference point causes the imager to compress brighter portions of a spectral line while not influencing the lower intensity portions of the same spectral line.

In an alternative exemplary embodiment, the drains 125 are eliminated from one or more of the cells 115 to increase sensitivity. Sensitivity is increased since no photons are lost to the drains 125. In an exemplary embodiment, drains 125 are eliminated from at least a portion of the first bank (bank 1) of the CCD 100 with drains 125 in the remaining banks such that at least the first bank (bank 1) exhibits a high level of sensitivity to low intensity spectral lines. For example, drains may be eliminated from regions 129. Drains may be added toward the end of a bank as a transition to a charge clipper.

In accordance with this alternative exemplary embodiment, the barriers 130 may be increased (e.g., through ion implantation) along cells/banks without drains 125 to form a channel stop that prevents charge from blooming into adjacent columns. The channel stop results in charge that exceeds the capacity of a cell blooming vertically rather than spilling into adjacent columns or being drained away. Since vertical resolution is typically not a concern in spectroscopy, vertical blooming among cells within a bank is acceptable. A vertical blooming barrier 132 and drain 127 may be added to the top of the first bank (bank 1) to contain vertical bloomed charge. Charge that blooms toward the charge clipper of the first bank is removed by the first charge clipper (e.g., of stage 105).

Figure 5B:
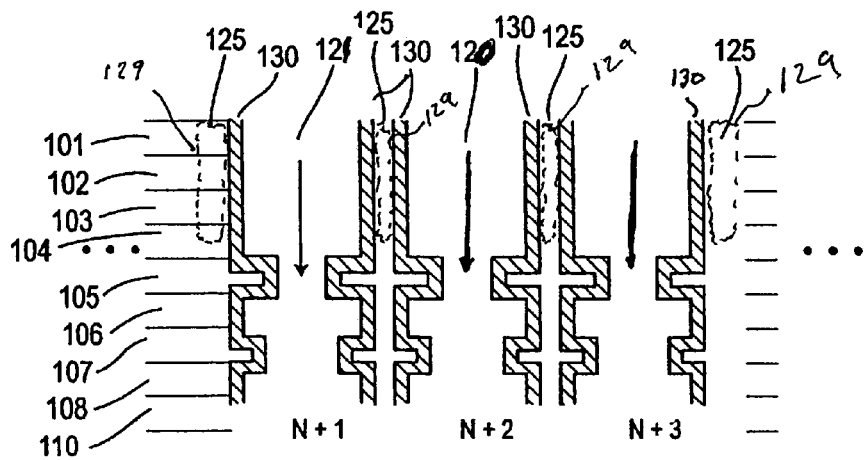
FIG. 5b illustrates another exemplary embodiment of limiting charge capacity in accordance with an aspect of the present invention.

FIG. 5b illustrates another exemplary embodiment for fabricating a CCD 100, similar to that described with reference to FIG. 5a, wherein the physical width of barrier 130 is substantially constant. This embodiment is advantageous as the width of drain 125 is correspondingly increased when the size of cell 115 is decreased. This increase in the width of the drain 125 allows for the draining of excessive accumulated charge.

Figure 6:
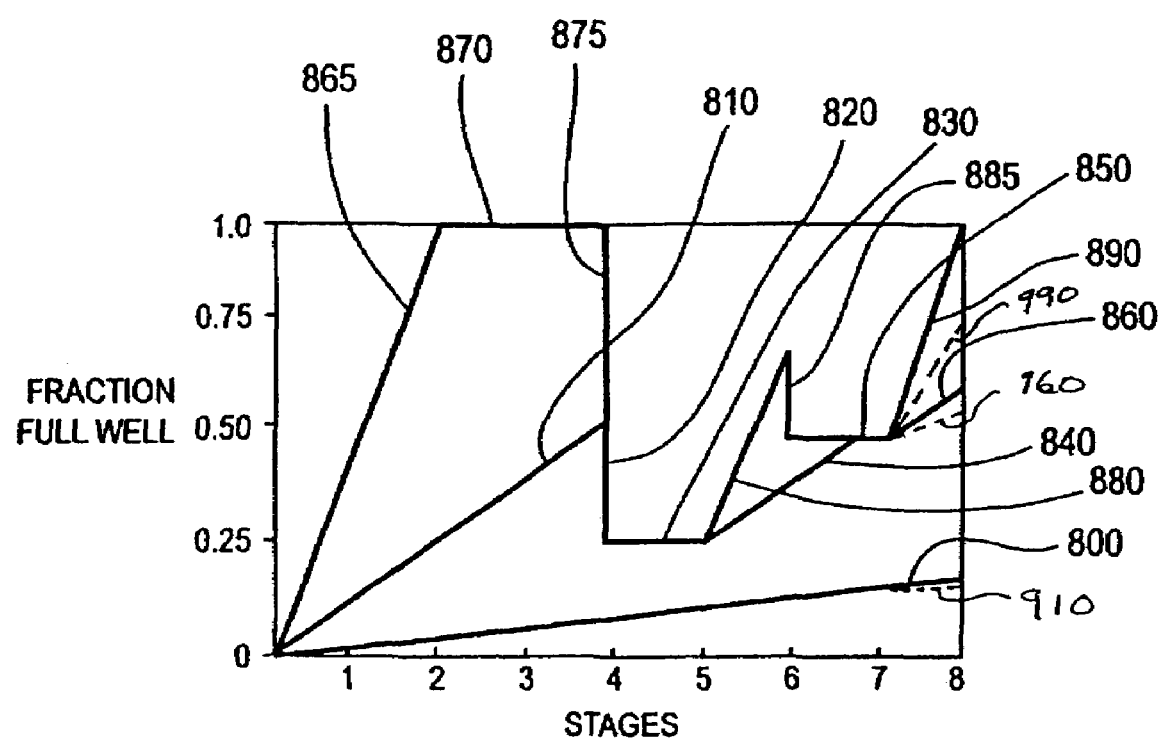

FIG. 6 illustrates the response characteristics of the embodiments described above with reference to FIGS. 5a and 5b to the three exemplary spectral lines described above with reference to FIG. 3. The response characteristic to the first exemplary spectral line is represented by the response characteristic 800. As discussed previously, the accumulated charge in stages 101 through 108 remains lower than the associated barrier levels. Thus, the selectively set levels do not influence the response characteristic of the CCD to this first spectral line. With regard to the second spectral line as discussed in regard to FIG. 3, the charge accumulated in stages 101 through 104, as represented by response 810, rises to maximum level 465. At stage 105, however, the charge capacity of cell 115 is set to twenty-five percent of maximum level 465. Accordingly, the accumulated charge above this twenty-five percent level is drained off at stage 105, as represented by response 820. Furthermore, any additional charge collected during stage 105 is also drained off. Thus, the accumulated charge remains limited, as represented by response characteristic 830. At stage 106, the charge capacity of cell 115 is again increased to maximum level 465 and charge is again accumulated, as represented by response characteristic 840. At stage 107, the charge capacity of the associated cell 115 is reduced to fifty percent. Any charge collected above this fifty-percent level is, accordingly, drained off and the accumulated charge remains at a fixed level, as is represented by response characteristic 850. At the beginning of stage 108, the charge capacity of the associated cell 115 increases to maximum level 465 and charge again is accumulated, as represented by response characteristic 860. Accordingly, both the brightest and dimmest spectral line(s) are collected without loss of detail. The altered reference points compress the spectral line data to allow cells 115 to accumulate charge that would otherwise be greater than their maximum capacity. These alterations in the reference points allow for the collection of data from brighter spectral lines that would otherwise be lost without affecting low light level performance.

With regard to the third exemplary spectral line, as described above with reference to FIG. 3, the accumulated charge quickly rises to a maximum level 465, as illustrated by response characteristic 865. Any additional charge that may be collected in stages 102-104 is drained off, as represented by response characteristic 870. At stage 105, the charge capacity of the associated cell 115 is set at twenty-five percent and any accumulated charge above this level is drained off, as represented by response characteristic 875. Further, any additional charge collected is similarly drained off and the accumulated charge level remains constant, as represented by response characteristic 830. At stage 106, the charge capacity of the associated cell 115 is again increased to maximum level 465. The charge is again accumulated, as represented by response characteristic 880. At the beginning of stage 107, the charge capacity of the associated cell 115 is again reduced to fifty percent of the maximum level, and the accumulated charge above this reduced level is again drained off, as represented by response characteristic 885. The accumulated charge remains fixed at this level as any additional charge collected is drained off, as represented by response characteristic 850. At stage 108, the charge capacity of the associated cell 115 is again increased and the accumulated charge again increases, as represented by response 890. The brightest portions of this third exemplary spectral line are thus captured.

A further increase in dynamic range may be achieved by placing a filtering element over at least one stage (or bank) of the CCD 100. Filter elements are used to further extend dynamic range by reducing the intensity of a spectral line in one or more collection stages (or banks). FIG. 5a illustrates the placement of filter 500 over stage 108. In this embodiment, in addition to selectively setting barrier levels, filter 500 is used to reduce the spectral line intensity of the portion of the spectral line incident on the cell 115 of stage 108.

Filter 500 may be, for example, a neutral-density filter or a slotted filter, e.g., a horizontally slotted metal filter. A suitable filter for use with the present invention will be understood by one of skill in the art from the description herein.

FIG. 6 further illustrates the response characteristic of the CCD 100 illustrated in FIG. 5a with filter 500 positioned over stage 108. In this example, the response to the three exemplary spectral lines is similar to the responses illustrated in FIG. 6, except for the response in the filtered stage (i.e., stage 108), which are represented by dashed lines. That is, the response of this embodiment to the first exemplary spectral line is similar to response characteristic 800 of FIG. 6. The imposed filter 500, however, causes the spectral line intensity to decrease during charge collection at stage 108. The amount of charge collected is thus reduced and this reduction in the accumulated charge is represented by response characteristic 910. Similarly, the response characteristics of the second and third exemplary spectral lines for CCD 100 with filtering are similar to corresponding response characteristics for CCD 100 without filtering, except for the response characteristics during stage 108. With the imposed filter 500 placed over stage 108, the charge collection is reduced as represented by response characteristics 960 and 990, respectively. Thus, in accordance with the principles of the present invention, dynamic range of the CCD 100 is further extended by selectively using filters over at least one collection stage (or bank) to collect high intensity spectral lines.

Figure 7A:
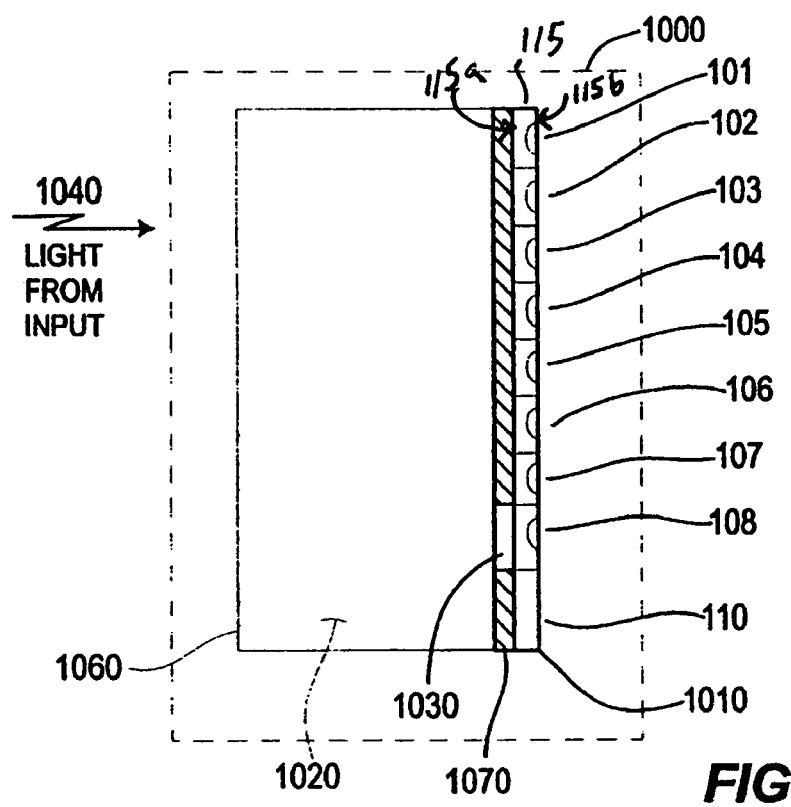
FIG. 7a illustrates a cross-sectional view of an exemplary embodiment of a back-illuminated CCD device having a response characteristic as illustrated in FIG. 6.

FIG. 7a illustrates a cross-sectional view of an exemplary embodiment of a back-illuminated CCD 1010 incorporating filtering over one stage (stage 108). In the back-illuminated CCD 1010, spectral lines 1040 impinge upon and pass through a back surface 115a of the cells 115 (e.g., a non-doped surface of the cells) prior to collection.

Figure 7B:
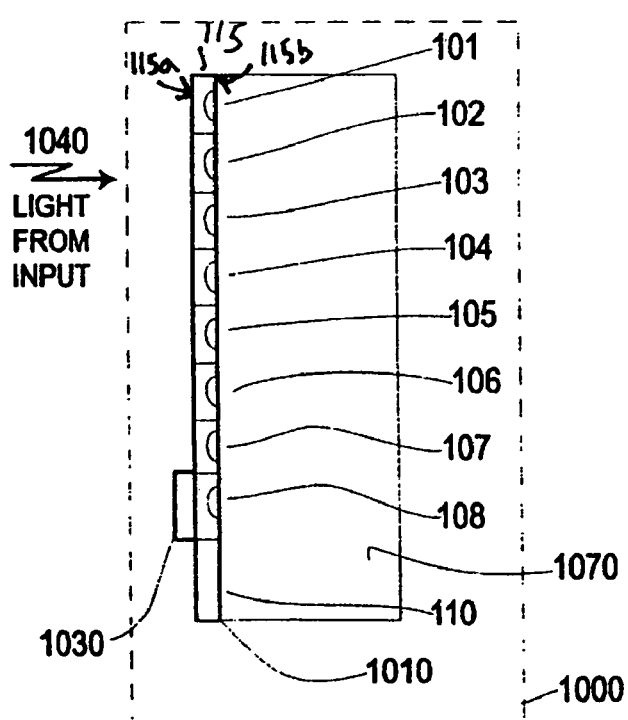
FIG. 7b illustrates a cross-sectional view of a second exemplary embodiment of a back-illuminated CCD device having a response characteristic as illustrated in FIG. 6.

FIG. 7b illustrates a cross-sectional view of a second exemplary embodiment of a back-illuminated CCD 1010 incorporating filtering over one stage (stage 108). It will be understood by one of skill in the art that the principles of the invention are equally applicable to a front-illuminated CCD 1011 in which spectral lines first impinge upon a front surface 115b of the cells 115 (e.g., a doped surface of the cells) from the description herein (see FIG. 7c for an exemplary front illuminated CCD 1011).

Using FIG. 7a as an illustrative example of a CCD 1010 constructed in accordance with the principles of the invention, spectral line light energy 1040 originating from a light source 14 (FIG. 1) is sequentially collected in each of the collection stages 101-108. As illustrated, CCD 1010 is composed of eight (8) stages (i.e., stages 101-108). Stages 101-108 are formed in a wafer 1000, which is typically made of a semi-conductor material, such as silicon or GaAs.

Attached to wafer 1000 is block 1020. Block 1020 provides support and protection for wafer 1000. Typically block 1020 is an optically transparent material. For example, for CCDs 1010 used in the visible light range, block 1020 may be constructed of materials such as glass, plastic, acrylic or polymer, that allows light 1040 to pass without significant degradation or loss. For imagers operating in the IR region, block 1020 may be constructed of materials such as silicon. For imagers operating in the UV region, block 1020 may be materials such as quartz and calcium chloride.

Filter 1030 is positioned on surface 1070 between block 1020 and wafer 1010. Filter 1030, similar to filter 500 discussed previously, is positioned over stage 108 to reduce the charge collected in this stage. As should be understood, the placement of filter 1030 is not limited to surface 1070, as illustrated. Rather, filter 1030 may be placed, for example, on surface 1060, or may even be incorporated within block 1020 to achieve a reduction in the intensity of the spectral lines. For example, a filter may be included within block 1020, by altering the reflectivity of the material of block 1020. The altered reflectivity reduces the intensity of light that traverses block 1020 and is collected in stages 101-108 in wafer 1000. Further still, filter 1030 may be incorporated onto wafer 1000. Placing filter 1030 on wafer 1000, however, may affect wafer 1000 when a change of filtering is necessary. Incorporating filter 1030 onto block 1020 allows for filter changes without affecting wafer 1000.

Filters may be used over a plurality of stages and each of these filters need not cause the same reduction in image intensity. For example, filters may be graduated along the depth of a CCD 1010 such that no filtering occurs in the earlier collection stages while significant reductions of intensity occurs in the latter collection stages. Graduated filtering, thus, does not affect the low intensity portions of any image but will affect the brighter portions.

Figure 7C:
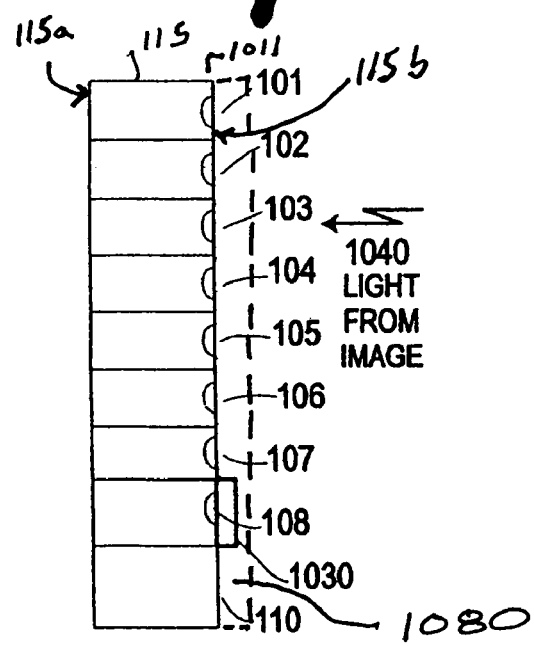
FIG. 7c illustrates a cross-sectional view of an exemplary embodiment of a front-illuminated CCD device having a response characteristic as illustrated in FIG. 6.

FIG. 7c illustrates a cross-sectional view of an exemplary embodiment of an 8-stage front-illuminated CCD 1011 incorporating filtering over one stage (stage 108). In addition, FIG. 7c illustrates an optional spectral wavelength converter 1080 over the stages of the CCD 110. The spectral wavelength converter 1080 converts spectral lines from one wavelength (e.g., a UV wavelength) to another wavelength (e.g., a visible light wavelength) for detection. The spectral wavelength converter 1080 enables a CCD 1011 (and other components such as filters and apertures) that is not sensitive to the wavelength of a spectral line to image the spectral line by converting the wavelength of the spectral line to one that the CCD 1011 (and other components) is sensitive. For example, if the CCD 1011 is only sensitive to visible light wavelengths and a UV wavelength is to be detected, a spectral wavelength converter 1080 capable of visible to UV wavelength conversion can be applied to the front surface of the CCD 1011 to convert the UV wavelength to visible light for detection by the CCD 1011. Likewise, filters and/or apertures designed for use with visible light may be used with the UV wavelength converted to visible light. An exemplary material for the spectral wavelength converter 1080 is Lumigen produced by Lumigen, Inc. of Southfield, Mich., USA. Other suitable materials for use as a spectral wavelength converter 1080 will be understood by one of skill in the art from the description herein.

Figure 8:
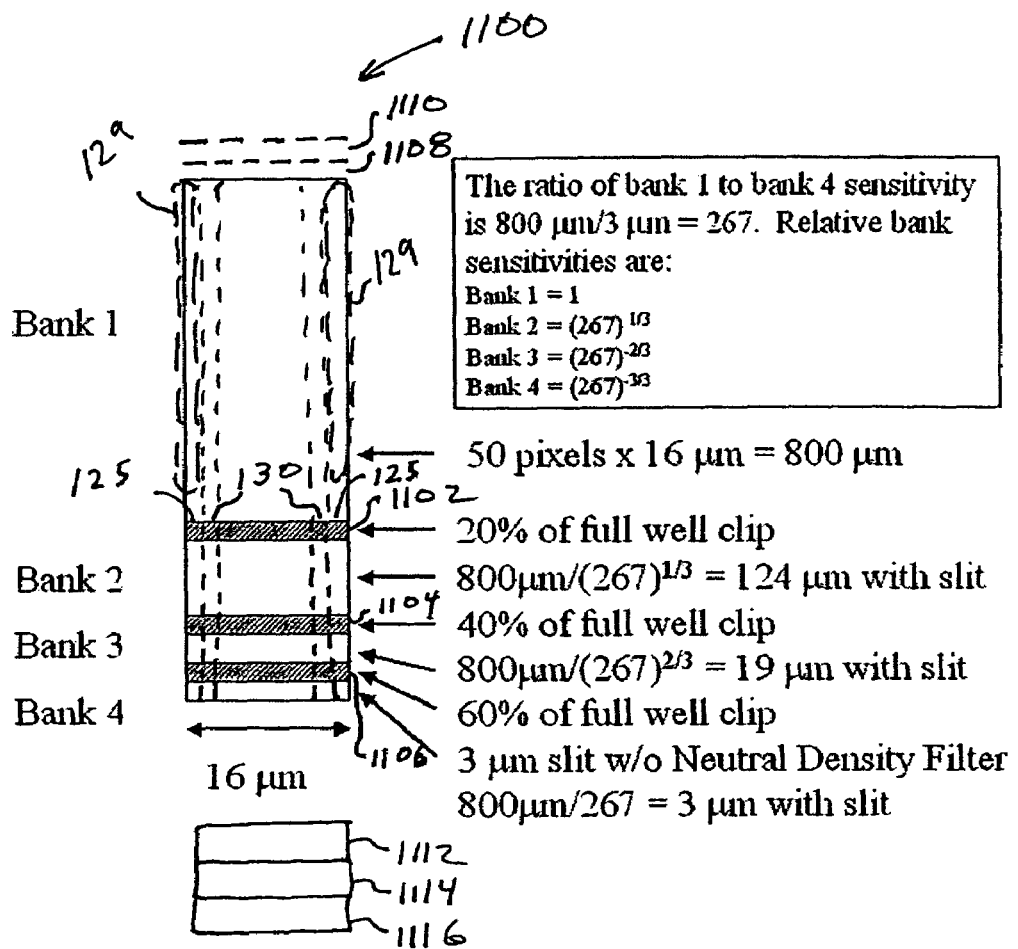
FIG. 8 illustrates another exemplary embodiment of limiting charge capacity in accordance with an aspect of the present invention.

FIG. 8 depicts a portion of an alternative exemplary CCD 1100. The illustrated CCD 1100 includes four banks of cells. In an exemplary embodiment, the first bank of cells (bank 1) is designed for maximum sensitivity and the remaining banks of cells (banks 2-4) are designed to have progressively lower sensitivity to increase the dynamic range of the CCD 1100. Increased sensitivity is achieved by removing the drains 125 from the first bank of cells. In the illustrated embodiment, the remaining banks of cells (banks 2-4) include drains 125 where loss of signal to the barriers and drains is less of a concern since these banks are designed for lower sensitivity than the first bank. The barriers 130 in regions without drains 125 (e.g., regions 129) may be increase to form a channel stop that prevents charge from blooming into adjacent columns. The channel stop results in charge that exceeds the capacity of a cell blooming vertically rather than spilling into adjacent columns or being drained away.

In the illustrated embodiment, charge clippers are used in the first, second, and third banks of cells (banks 1-3). A first charge clipper 1102 is a twenty percent full well charge clipper for the first bank of cells (bank 1), a second charge clipper 1104 is a forty percent full well charge clipper for the second bank of cells (bank 2), and a third charge clipper is a sixty percent charge clipper for the third bank of cells (bank 3). The fourth bank of cells (bank 4) does not include a charge clipper and, thus, is allowed to accumulate up to the maximum charge capacity of cells.

A vertical blooming barrier 1108 and drain 110 may be added to the top of the first bank (bank 1) to contain bloomed charge. Charge that blooms within the first bank (bank 1) toward the first charge clippers 1102 is removed by that charge clipper. As described above, maximum dynamic range may be further extended through the use of filters such as optical slits and neutral density filters. Optical slits may be slits/openings in an opaque mask material positioned between the CCD 1100 and the light source 14 (FIG. 1). The formation of suitable slits/opening for use in the present invention will be understood by one of skill in the art from the description herein.

In an exemplary embodiment, the first bank of cells (bank 1) includes 50 cells. Each of the 50 cells in the first bank of cells is a 16 micro-meter by 16 micro-meter cell. Thus, the first bank of cells (bank 1) forms an 800 micrometer linear photonic charge collection area. The second bank of cells (bank 2) includes an 124 micrometer linear photonic charge collection area. To achieve a 124 micrometer collection area, a 124 micrometer horizontal opening/slit (e.g., in an opaque mask) may be place in front of eight 16 micro-meter cells, which would have a 128 micrometer linear photonic charge collection area (i.e., 8*16=128) without the horizontal opening/slit. The third bank of cells (bank 3) includes a 19 micrometer linear photonic charge collection area. To achieve a 19 micrometer collection area, a 19 micrometer horizontal opening/slit may be place in front of two 16 micro-meter cells, which would have a 32 micrometer linear photonic charge collection area (i.e., 2*16=128) without the horizontal opening/slit. The fourth bank of cells (bank 4) includes a three micrometer linear photonic charge collection area. To achieve a three micrometer collection area, a three micrometer horizontal opening/slit may be place in front of one 16 micro-meter cell, which would have a 16 micrometer linear photonic charge collection area (i.e., 1*16=16) without the horizontal opening/slit. A sensitivity ratio of the first bank to the fourth bank is 267 (800/3=approximately 267) and the relative bank sensitivities are as follows: bank 1=1; bank 2=$267^{-1/3}$; bank 3=$267^{-2/3}$; and bank 4=$267^{-3/3}$.

In an exemplary embodiment, the CCD 1100 includes an output register 1112. A blooming drain 1116 and barrier 1118 may be added to the bottom of the output register 1112. Charge binning to the output register 1112 may be employed to improve signal to noise ratio for low intensity spectral lines. High intensity spectral lines, which normally would bloom in the output register 1112, do not bloom because of the added output register blooming drain 1116 and barrier 1114. Each bank may be binned in the output register 1112. With 4 banks, four lines are read to the output register 1112. First, bank 1 is read out to the output register 1112 followed by banks 2 and 3. Last, bank 4 is readout to the output register 1112.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A spectrometer comprising: a light disperser configured to receive light and to provide a plurality of spectral lines, each corresponding to a respective component of the received light; and a time delay and integrate (TDI) imager including a plurality of columns configured to be scanned along the columns to produce integrated image data for each column at respective stages of an output register; wherein the light disperser and the TDI imager are arranged so that the spectral lines are formed on columns of the TDI imager;
   wherein the TDI imager has a plurality of cells arranged in a plurality of rows for imaging one or more spectral lines, the cells providing an output representing accumulated charge for the plurality of spectral lines; and
   wherein the TDI imager comprises: at least one channel of cells, the channel including at least one cell from each of the rows, the cells within the channel grouped into a plurality of banks; at least one horizontal blooming barrier and drain coupled to a corresponding one of the one or more banks, the at least one horizontal blooming barrier and drain limiting accumulated charge in the corresponding bank such that the amount of charge accumulated and retained in at least one subsequent bank is incrementally increased.

2. The spectrometer of claim 1, wherein the TDI imager is a front illumination imaging apparatus and wherein the TDI imager further comprises: a spectral wavelength converter disposed over the at least one channel of cells.

3. The spectrometer of claim 2, wherein the spectral wavelength converter converts one or more UV wavelengths to one or more visible wavelengths.

4. The spectrometer of claim 1, wherein a first bank of the plurality of banks includes a channel stop having a horizontal blooming baffler without a horizontal blooming drain.

5. The spectrometer of claim 4, wherein the horizontal blooming baffler of the channel stop is greater than the at least one horizontal blooming baffler.

6. The spectrometer of claim 4, wherein the first bank includes a vertical blooming baffler adjacent a first cell within the first bank.

7. The spectrometer of claim 1, further comprising at least one filter corresponding to one or more cells disposed over the one or more corresponding cells, the at least one filter reducing the charge collected in the corresponding cells.

8. The spectrometer of claim 7 wherein the filter is a neutral density filter.

9. The spectrometer of claim 7 wherein the filter is a slotted filter.

10. The spectrometer of claim 7 wherein the imaging apparatus further comprises a spectral wavelength converter disposed over the filter.

11. The spectrometer of claim 1 wherein the at least one horizontal baffler is set to limit the accumulated charge in designated ones of the plurality of rows within the plurality of banks.

12. The spectrometer of claim 1, further comprising an output register coupled to each of the plurality of banks, wherein charge accumulated in each of the plurality of banks is read directly to the output register.

13. The spectrometer of claim 12, further comprising a blooming barrier positioned adjacent the output register.

14. A spectroscopy imager for imaging light from a light source, the spectroscopy imager comprising: a light disperser that receives the light from the light source and disperses the light into one or more spectral lines; a charge coupled device array (CCD) having a plurality of cells arranged in a plurality of rows for imaging one or more spectral lines, the cells providing an output representing accumulated charge for the one or more spectral lines, comprising: a plurality of channels of cells, the channels including at least one cell from each of the rows, the cells within the channels grouped into a plurality of banks; at least one horizontal blooming barrier and drain coupled to a corresponding one of the one or more banks, the at least one horizontal blooming barrier and drain limiting accumulated charge in the corresponding bank such that the amount of charge accumulated and retained in at least one subsequent bank is incrementally increased.

15. The imager of claim 14, wherein the imager is a front illumination imager and wherein the imager further comprises: a spectral wavelength converter disposed over the at least one channel of cells.

16. The imager of claim 14, wherein a first bank of the plurality of banks includes a channel stop including a horizontal blooming barrier without a horizontal blooming drain.

17. The imager of claim 14, wherein the horizontal blooming barrier of the channel stop is greater than the at least one horizontal blooming barrier.

18. The imager of claim 14, further comprising at least one filter corresponding to one or more cells disposed over the one or more corresponding cells, the at least one filter reducing the charge collected in the corresponding cells.

19. The imager of claim 18 wherein the imaging apparatus further comprises a spectral wavelength converter disposed over the filter.

20. The imager of claim 14, further comprising an output register coupled to each of the plurality of banks, wherein charge accumulated in each of the plurality of banks is read directly to the output register.

21. The imager of claim 14, wherein the light disperser is a slit.

22. The imager of claim 14, wherein the light disperser is a grating or a prism.

23. A method of operating an imager that includes a plurality of cells for imaging one or more spectral lines, the cells arranged to form at least one channel for receiving the one or more spectral lines that provides an output representing accumulated charge for the at least one spectral line, the cells within the channel grouped into a plurality of banks, the method comprising the steps of: accumulating charge from the plurality of cells in each of the plurality of banks; passing the charges accumulated in at least one of the plurality of banks through corresponding limiting cells associated with the at least one of the plurality of banks to limit the charge accumulated by the at least one of the plurality of banks such that the amount of charge accumulated and retained in at least one subsequent bank is incrementally increased; and accumulating charge from each of the plurality of banks.

24. The method of claim 23, wherein the step of accumulating charge from each of the plurality of banks comprises the steps of: binning the charges from each of the plurality of banks; and reading the binned charges directly out to an output register.

25. The method of claim 23 further comprising the step of: converting a wavelength of at least one spectral line to a wavelength compatible with the plurality of cells.

26. The method of claim 23, further comprising the step of: filtering portions of at least one spectral line corresponding to one or more cells to reduce the charge accumulated in the corresponding cells.

27. The method of claim 26, further comprising the step of: converting the wavelength of at least one spectral line to a wavelength compatible with the filtering step.

* * * * *